United States Patent
Jeon et al.

(10) Patent No.: US 7,071,051 B1
(45) Date of Patent: Jul. 4, 2006

(54) METHOD FOR FORMING A THIN, HIGH QUALITY BUFFER LAYER IN A FIELD EFFECT TRANSISTOR AND RELATED STRUCTURE

(75) Inventors: Joong S. Jeon, Cupertino, CA (US); Robert B. Clark-Phelps, Northborough, MA (US); Qi Xiang, San Jose, CA (US); Huicai Zhong, Wappinger Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/761,009

(22) Filed: Jan. 20, 2004

(51) Int. Cl.
*H01L 21/8238* (2006.01)

(52) U.S. Cl. ........................ 438/216; 438/197; 438/585

(58) Field of Classification Search ................ 438/197, 438/216, 585
See application file for complete search history.

(56) References Cited

U.S. PATENT DOCUMENTS 6,563,183 B1 * 5/2003 En et al. ...................... 257/410
2005/0048765 A1 * 3/2005 Kim ........................... 438/623

* cited by examiner

Primary Examiner—Long Pham
(74) Attorney, Agent, or Firm—Farjami & Farjami LLP

(57) ABSTRACT

According to one exemplary embodiment, a method for forming a field-effect transistor on a substrate comprises a step of forming a buffer layer on the substrate, where the buffer layer comprises ALD silicon dioxide. The buffer layer can be formed by utilizing a silicon tetrachloride precursor in an atomic layer deposition process, for example. The buffer layer comprises substantially no pin-hole defects and may have a thickness, for example, that is less than approximately 5.0 Angstroms. The method further comprises forming a high-k dielectric layer over the buffer layer. The high-k dielectric layer may be, for example, hafnium oxide, zirconium oxide, or aluminum oxide. According to this exemplary embodiment, the method further comprises forming a gate electrode layer over the high-k dielectric layer. The gate electrode layer may be polycrystalline silicon, for example.

10 Claims, 2 Drawing Sheets

METHOD FOR FORMING A THIN, HIGH QUALITY BUFFER LAYER IN A FIELD EFFECT TRANSISTOR AND RELATED STRUCTURE

TECHNICAL FIELD

The present invention is generally in the field of semiconductor devices. More particularly, the present invention is in the field of fabrication of field effect transistors.

BACKGROUND ART

As field effect transistors ("FET"), such as PFETs and NFETs, are scaled down in size, semiconductor manufactures have utilized gate dielectrics having a high dielectric constant ("high-k") to improve FET performance and reliability. High-k gate dielectrics are desirable in small feature size technologies since conventional gate dielectrics, such as silicon dioxide ("$SiO_2$"), are too thin and they result in high tunneling current, as well as other problems, which decrease performance and reliability of FETs. However, when a high-k gate dielectric layer is formed on a silicon substrate in a conventional FET fabrication process, an unintentional layer of low quality silicon dioxide forms at the interface between the silicon substrate and the high-k gate dielectric layer, which can degrade the performance of the FET.

In a conventional process for fabricating a FET having a high-k gate dielectric, a high-k dielectric layer comprising, for example, hafnium oxide or zirconium oxide, is generally formed over a channel region of a substrate at a relatively low temperature. As a result, oxygen in the high-k dielectric layer can diffuse out of the high-k dielectric layer and combine with silicon in the substrate to form an interfacial layer of thermally grown $SiO_2$ at the high-k dielectric/substrate interface. The interfacial layer formed in the above manner comprises an undesirable non-uniform, low quality $SiO_2$, which has pin-hole defects as a result of the relatively low temperature at which the $SiO_2$ is typically grown. Furthermore, since interfacial layer has a low dielectric constant and a typical thickness of approximately 10.0 Angstroms, the interfacial layer causes an undesirable reduction in the effective dielectric constant value between a gate electrode formed over the high-k dielectric layer and the substrate. Consequently, as a result of low quality, non-uniformity, pin-hole defects, and the relative thickness of the thermally grown $SiO_2$ in the interfacial layer, the performance of the FET can be undesirably degraded.

Thus, there is a need in the art for an effective method for forming a field effect transistor having a high-k dielectric without forming a low-quality thermal silicon dioxide at the high-k dielectric/substrate interface.

SUMMARY

The present invention is directed to method for forming a thin, high quality buffer layer in a field effect transistor and related structure. The present invention addresses and resolves the need in the art for an effective method for forming a field effect transistor having a high-k dielectric without forming a low-quality thermal silicon dioxide at the high-k dielectric/substrate interface.

According to one exemplary embodiment, a method for forming a field-effect transistor on a substrate comprises a step of forming a buffer layer on the substrate, where the buffer layer comprises ALD silicon dioxide. The buffer layer can be formed by, for example, utilizing a silicon tetrachloride precursor in an atomic layer deposition process. The buffer layer comprises substantially no pin-hole defects and may have a thickness, for example, that is less than approximately 5.0 Angstroms. The method further comprises forming a high-k dielectric layer over the buffer layer. The high-k dielectric layer may be, for example, hafnium oxide, zirconium oxide, or aluminum oxide.

According to this exemplary embodiment, the method further comprises forming a gate electrode layer over the high-k dielectric layer. The gate electrode layer may be polycrystalline silicon, for example. In one embodiment, the invention is a field effect transistor fabricated by utilizing the above-discussed method. Other features and advantages of the present invention will become more readily apparent to those of ordinary skill in the art after reviewing the following detailed description and accompanying drawings.

DETAILED DESCRIPTION OF THE INVENTION

The present invention is directed to method for forming a thin, high quality buffer layer in a field effect transistor and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
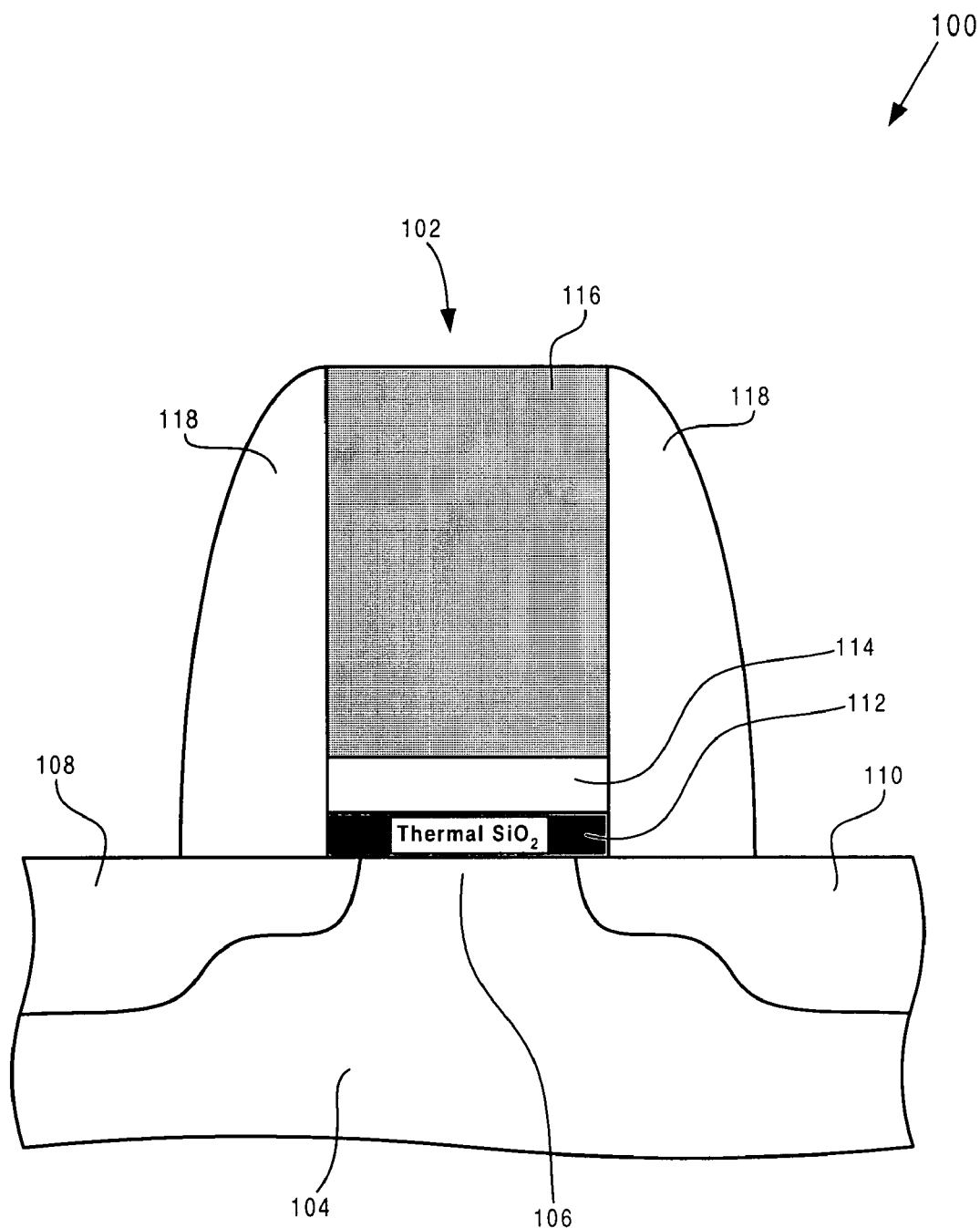
FIG. 1 illustrates a cross-sectional view of a structure including an exemplary conventional field-effect transistor.

FIG. 1 shows a cross-sectional view of an exemplary structure including a conventional exemplary FET. Structure 100 includes conventional FET 102, which is situated on substrate 104. Conventional FET 102 includes channel region 106, source 108, drain 110, interfacial layer 112, high-k dielectric layer 114, gate electrode layer 116, and spacers 118. Conventional FET 102 can be an NFET, a PFET, or a MOSFET, such as an NMOS or PMOS transistor.

As shown in FIG. 1, source 108 and drain 110, which are formed in a manner known in the art, are situated in substrate 104 and channel region 106 is situated between source 108 and drain 110. Further shown in FIG. 1, interfacial layer 112 is situated on substrate 104 and high-k dielectric layer 114 is situated on buffer layer 112. High-k dielectric layer 114 can be deposited over substrate 104 utilizing a chemical vapor deposition ("CVD") process or other appropriate processes at a relatively low temperature and can comprise a high-k dielectric such as hafnium oxide or zirconium oxide. After formation of high-k dielectric layer 114, oxygen in high-k dielectric layer 114 diffuses out of high-k dielectric layer 114 and combines with silicon in substrate 104. As a result, interfacial layer 112 is unintentionally grown at a relatively low temperature at the interface between high-k dielectric layer 114 and substrate 104 and comprises a non-uniform, low quality layer of thermal $SiO_2$. Additionally, undesirable pin-hole defects can form in interfacial layer 112 as a result of the low temperature at which interfacial layer 112 is grown. Interfacial layer 112 can have a thickness of approximately 10.0 Angstroms, for example.

Further shown in FIG. 1, gate electrode layer 116 is situated over high-k dielectric layer 114. Gate electrode layer 116 can comprise polycrystalline silicon or other appropriate conductive material and can be formed in a manner known in the art. Also shown in FIG. 1, spacers 118 are situated on either side of a gate stack comprising interfacial layer 112, high-k dielectric layer 114, and gate electrode layer 116. Spacers 118 can comprise an appropriate dielectric material and can be formed in a manner known in the art.

In conventional FET 102, as a result of the thickness, i.e. approximately 10.0 Angstroms, of interfacial layer 112 and the low dielectric constant value of thermal $SiO_2$, interfacial layer 112 causes an undesirable reduction in the effective dielectric constant value between gate electrode layer 116 and substrate 104. Furthermore, the non-uniform, low quality thermal $SiO_2$ in interfacial layer 112 can cause an undesirable degradation in the performance of conventional FET 102.

Figure 2:
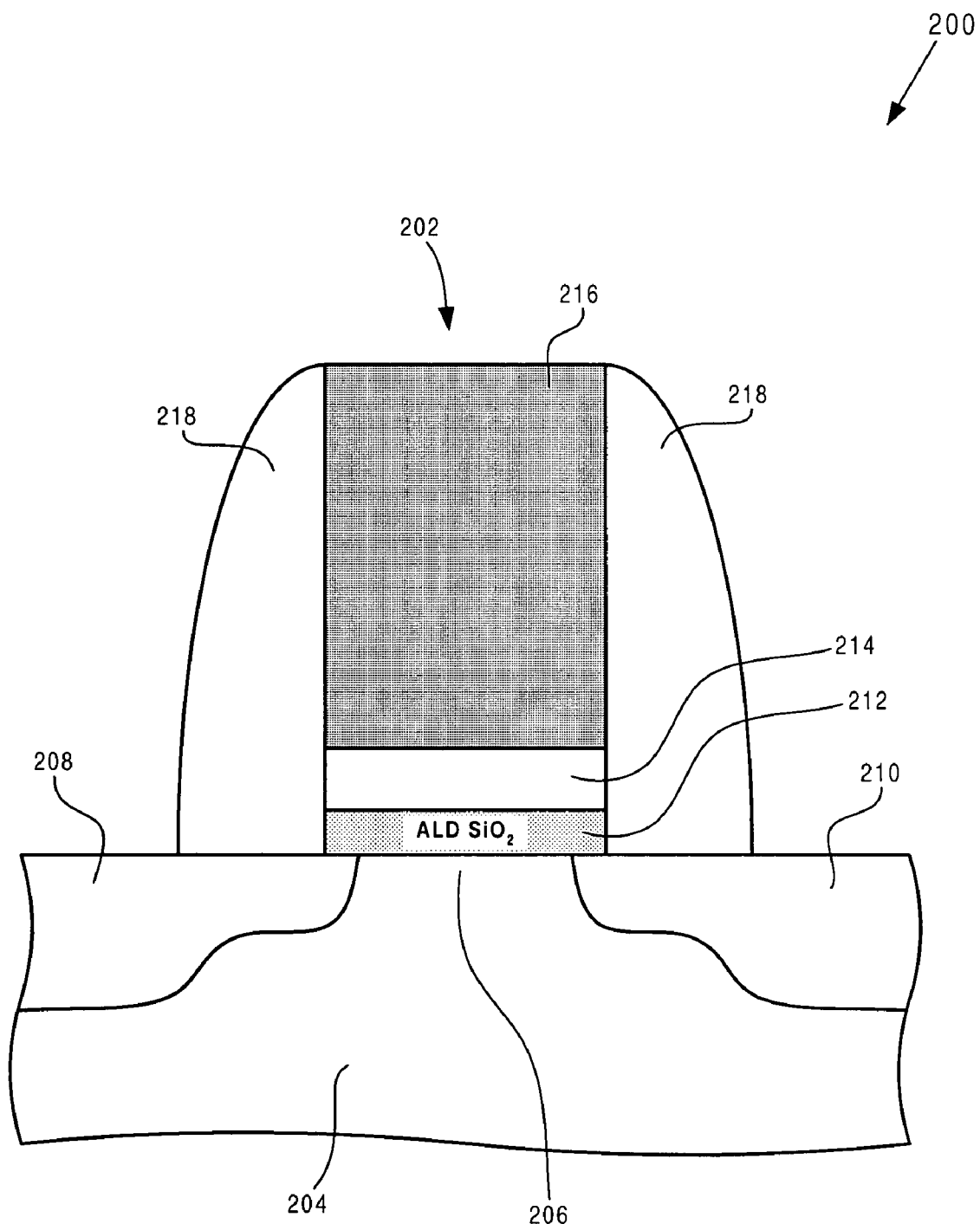
FIG. 2 illustrates a cross-sectional view of a structure including an exemplary field-effect transistor, in accordance with one embodiment of the present invention.

FIG. 2 shows a cross-sectional view of an exemplary structure including an exemplary FET in accordance with one embodiment of the present invention. Structure 200 includes FET 202, which is situated on substrate 204. FET 202 includes channel region 206, source 208, drain 210, buffer layer 212, high-k dielectric layer 214, gate electrode layer 216, and spacers 218. In the present embodiment, FET 202 can be an NFET or a PFET. In one embodiment, FET 202 can be a MOSFET, such as an NMOS or PMOS transistor.

As shown in FIG. 2, source 208 and drain 210, which are formed in a manner known in the art, are situated in substrate 204 and channel region 206 is situated between source 208 and drain 210. Further shown in FIG. 2, buffer layer 212 is situated on substrate 204 over channel region 206 and comprises atomic layer deposition ("ALD") $SiO_2$, which is formed in an ALD process. For example, buffer layer 212 can be formed in an ALD process by depositing a precursor, such as silicon tetrachloride ("$SiCl_4$"), on substrate 204. The precursor, i.e. $SiCl_4$, is combined with water ("$H_2O$") to form hydrogen chloride ("HCl"), which is removed as a gas, and to form an atomic layer of $SiO_2$. The cycle of depositing $SiCl_4$, combining it, i.e. $SiCl_4$, with $H_2O$, and removing the resulting HCl gas is repeated to form each atomic layer of $SiO_2$. As a result, buffer layer 212 is formed one atomic layer at a time to achieve a layer of ALD $SiO_2$ having a controlled thickness. By way of example, buffer layer 212 can have a thickness less than approximately 5.0 Angstroms. In another embodiment, a precursor other than $SiCl_4$ can be utilized to form buffer layer 212 on substrate 204 in the ALD process. As a result of the ALD process discussed above, the present invention achieves a buffer layer, i.e. buffer layer 212, which comprises a layer of ALD $SiO_2$ having high quality, precisely controlled thickness, uniformity, and substantially no pin-hole defects. For example, buffer layer 212 has a uniform thickness on substrate 204.

Further shown in FIG. 2, high-k dielectric layer 214 is situated over buffer layer 212. High-k dielectric layer 114 can be formed by depositing a layer of high-k dielectric, such as aluminum oxide, hafnium oxide, or zirconium oxide, over buffer layer 12 by utilizing a CVD process or other appropriate processes as known in the art. Also shown in FIG. 2, gate electrode layer 216 is situated over high-k dielectric layer 214 and can comprise polycrystalline silicon or other appropriate conductive material. Gate electrode layer 216 can be formed, for example, by depositing and patterning a layer of polycrystalline silicon in a manner known in the art. Further shown in FIG. 2, spacers 218 are situated either side of a gate stack comprising buffer layer 212, high-k dielectric layer 214, and gate electrode layer 216. Spacers 218 can comprise an appropriate dielectric material and can be formed in a manner known in the art.

Thus, by forming a buffer layer comprising ALD $SiO_2$, which is situated between a high-k dielectric layer and a substrate in a FET, the present invention advantageously achieves a buffer layer having high quality, uniformity, and a precisely controlled thickness. Furthermore, the present invention advantageously provides a buffer layer comprising substantially no pin-hole defects. In contrast, an interfacial layer, such as interfacial layer 112 in FIG. 1, that is unintentionally formed in a conventional FET, such as FET 102, at a high-k dielectric/substrate interface comprises a thermal $SiO_2$ layer having low quality, non-uniformity, and pin-hole defects and is undesirably thick. Thus, by forming a buffer layer comprising ALD $SiO_2$ on a substrate prior to formation of a high-k dielectric layer, the present invention advantageously prevents the formation of a conventional undesirable thermal $SiO_2$ layer at the high-k dielectric/substrate interface.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, method for forming a thin, high quality buffer layer in a field effect transistor and related structure have been described.

The invention claimed is:

1. A method of forming a field-effect transistor on a substrate, said method comprising steps of:
   utilizing a silicon tetrachloride precursor in an atomic layer deposition process to form a buffer layer on said substrate;
   forming a high-k dielectric layer over said buffer layer, said high-k dielectric layer being selected from the group consisting of hafnium oxide, zirconium oxide, and aluminum oxide.

2. The method of claim 1 further comprising a step of forming a gate electrode layer over said high-k dielectric layer.

3. The method of claim 1 wherein said buffer layer comprises substantially no pin-hole defects.

4. The method of claim 1 wherein said buffer layer has a thickness less than approximately 5.0 Angstroms.

5. The method of claim 2 wherein said gate electrode layer comprises polycrystalline silicon.

6. A method for forming a field effect transistor on a substrate, said method comprising a step of forming a buffer layer on said substrate, said method being characterized by:

utilizing a silicon tetrachloride precursor in an atomic layer deposition process to form said buffer layer on said substrate;

forming a high-k dielectric layer on said buffer layer, said high-k dielectric layer being selected from the group consisting of hafnium oxide, zirconium oxide, and aluminum oxide.

7. The method of claim 6 further comprising a step of forming a gate electrode layer over said high-k dielectric layer.

8. The method of claim 6 wherein said buffer layer comprises substantially no pin-hole defects.

9. The method of claim 6 wherein said buffer layer has a thickness less than approximately 5.0 Angstroms.

10. The method of claim 7 wherein said gate electrode layer comprises polycrystalline silicon.

* * * * *